United States Patent

Okazaki et al.

[11] Patent Number: 5,247,533
[45] Date of Patent: Sep. 21, 1993

[54] GALLIUM NITRIDE GROUP COMPOUND SEMICONDUCTOR LASER DIODE

[75] Inventors: Nobuo Okazaki; Katsuhide Manabe, both of Inazawa; Isamu Akasaki, 38-805, 1-ban, Joshin 1-chome, Nishi-ku, Nagoya-shi, Aichi-ken; Hiroshi Amano, 25-505, Nijigaokahigashidanchi, 21, Kamioka-cho 2-chome, Meito-ku, Nagoya-shi, Aichi-ken, all of Japan

[73] Assignees: Toyoda Gosei Co., Ltd., Nishikasugai; Isamu Akasaki; Hiroshi Amano, both of Nagoya, all of Japan

[21] Appl. No.: 812,913

[22] Filed: Dec. 26, 1991

[30] Foreign Application Priority Data

Dec. 26, 1990 [JP] Japan .................. 2-414843

[51] Int. Cl.$^5$ .............................................. H01S 3/19
[52] U.S. Cl. ........................................ 372/45; 372/43; 257/12; 257/13
[58] Field of Search ................ 372/45, 43; 357/17, 357/16; 257/12, 13, 79

[56] References Cited

U.S. PATENT DOCUMENTS

| | | | |
|---|---|---|---|
| 4,855,249 | 8/1989 | Akasaki et al. | 437/81 |
| 4,911,102 | 3/1990 | Manabe et al. | 118/719 |
| 5,005,057 | 4/1991 | Izumiya et al. | 357/17 |
| 5,146,465 | 9/1992 | Khan et al. | 372/45 |

FOREIGN PATENT DOCUMENTS 2-042770 2/1990 Japan .
2-257679 10/1990 Japan .
0209895 9/1991 Japan .................. 372/45

OTHER PUBLICATIONS

H. Amano, et al., "Stimulated Emission Near Ultraviolet at Room Temperature from a GaN Film Grown on Sapphire by MOVPE Using an AlN Buffer Layer", Japanese Journal of Applied Physics, vol. 29, No. 2, Feb., 1990 pp. 81-82.

*Primary Examiner*—Georgia Y. Epps
*Attorney, Agent, or Firm*—Cushman, Darby & Cushman

[57] ABSTRACT

A gallium nitride group compound semiconductor laser diode includes at least one pn junction layer disposed between an n-type layer and a p-type layer. The n-type layer is formed from a gallium nitride group compound semiconductor material defined by the composition equation $(Al_xGa_{1-x})_yIn_{1-y}N$ (where $0 \leq x \leq 1$ and $0 \leq y \leq 1$). The p-type layer, doped with an acceptor impurity, is obtained by electron beam irradiating a gallium nitride group compound semiconductor material defined by the composition equation $(Al_{x'}Ga_{1-x'})_{y'}In_{1-y'}N$ (where $0 \leq x' \leq 1$, $0 \leq y' \leq 1$, $x = x'$ or $x \neq x'$, and, $y = y'$ or $y \neq y'$). The improved gallium nitride group semiconductor laser diode of the present invention is found to emit light in the visible short wavelength spectrum of light which includes the blue, violet and ultraviolet regions.

7 Claims, 7 Drawing Sheets

GALLIUM NITRIDE GROUP COMPOUND SEMICONDUCTOR LASER DIODE

BACKGROUND OF THE INVENTION

1. Field of the Invention

This invention relates to semiconductor laser diodes, which can emit light in the visible short wavelength spectrum of light, particularly in the blue to violet and also in the ultraviolet region.

2. Description of the Prior Art

Presently used shortest wavelength current injection semiconductor laser diodes are produced from indium gallium aluminum phosphide (InGaAlP) group crystals. Their emission wavelengths are limited to the visible long wavelength region, i.e., a red region of 0.6 to 0.7 micrometers.

However, the physical properties of such material makes difficult the formation of semiconductor laser diodes which can emit light having a shorter wavelength region, i.e., in the blue and violet region or ultraviolet region of light. To overcome these deficiencies it becomes necessary to design laser diodes made from semiconductor materials having broader band gap energies. A typical such candidate material is $(Al_xGa_{1-x})_yIn_{1-y}N$.

Recent studies confirm $(Al_xGa_{1-x})_yIn_{1-y}N$, particularly GaN, is capable of st emission by photo-excitation at room temperature (300°K.) (see H. Amano et al, Japanese Journal of Applied Physics, Vol. 29, 1990, 1205–L206). Therefore, attempts have been made to produce a laser diode using this material.

Until recently, formation of a P-type single crystal thin film has been difficult to obtain and a current injection semiconductor laser diode using $(Al_xGa_{1-x})_yIn_{1-y}N$ has not been achieved.

SUMMARY OF THE INVENTION

The present invention seeks to solve the above problem. It is an object of the present invention to provide a semiconductor laser diode which can emit light in the short wavelength spectrum of light, i.e., in the blue and violet region or ultraviolet region.

A first feature of the invention relates to the formation of a diode having at least one pn junction disposed between an n-type layer formed from a gallium nitride group compound semiconductor material $((Al_xGa_{1-x})_yIn_{1-y}N, 0 \leq x \leq 1, 0 \leq y \leq 1)$ and a p-type layer obtained by electron beam irradiating a layer of an acceptor-doped gallium nitride group compound semiconductor material $((Al_{x'}Ga_{1-x'})_{y'}In_{1-y'}N, 0 \leq x' \leq 1, 0 \leq y' \leq 1, x = x'$ or $x$ not$= x'$, and, $y = y'$ or $y$ not$= y')$.

In a second feature of the invention, the n- and p-type layer semiconductor materials have the same band gap energies.

In a third feature of the invention the p- and n-type layer semiconductor materials form a junction therebetween comprising a first layer of a gallium nitride group compound semiconductor material having a comparatively large band gap energy and a second layer of a gallium nitride group compound semiconductor material having a comparatively small band gap energy.

In a fourth feature of the invention, a pn junction structure includes an active layer which has a comparatively small band gap energy. This active layer is sandwiched between alternately arranged layers, which may or may not have similar band gap energies and blend crystal compositions. The band gap energy of the alternately arranged layers is large in comparison with that of the active layer.

In a fifth feature of the invention, an active layer is formed by the lamination of two or more layers having different band gap energies.

In a sixth feature of the invention, contact portions on the layer formed by a p-type gallium nitride group compound semiconductor material for contact with electrode metals along the layer have a strip-like shape.

In a seventh feature of the invention, sapphire, Si, 6H-SiC or GaN is used as the substrate.

The present invention provides for the formation of a layer in a laser diode having a p-type conductivity $(Al_xGa_{1-x})_yIn_{1-y}N$ semiconductor material, where $0 \leq x \leq 1$ and $0 \leq y \leq 1$.

DETAILED DESCRIPTION OF THE PREFERRED EMBODIMENTS

Specific embodiments of the invention will now be described with reference to the drawings.

In the manufacture of single crystals for use in $(Al_xGa_{1-x})_yIn_{1-y}N, 0 \leq x \leq 1, 0 \leq y \leq 1)$ group semiconductor laser diodes, a horizontal organic metal compound vapor phase growth apparatus is used.

The growth procedure of a laser diode formed in accordance with the present invention will be described in connection with any one of a sapphire, Si, 6H-SiC and GaN as the substrates of choice in the following examples.

EXAMPLE 1 using a sapphire substrate

Figure 1:
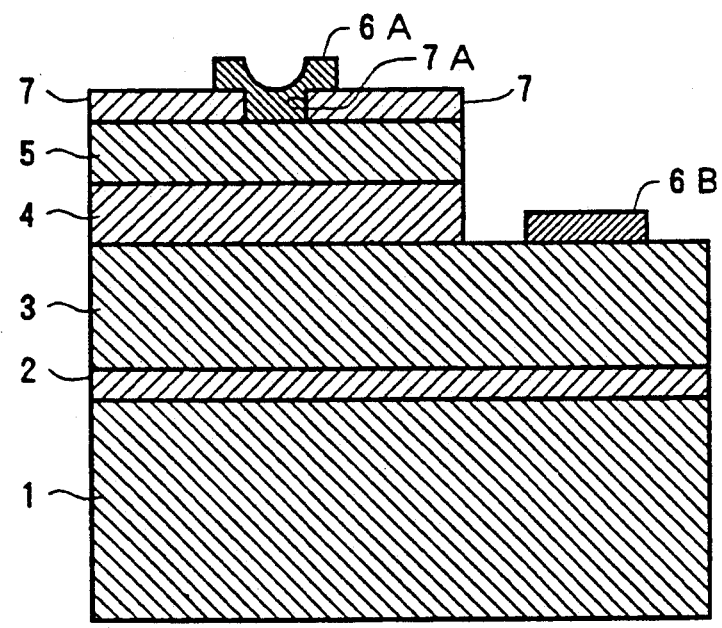
FIG. 1 is a sectional view showing an embodiment of the invention applied to a $(Al_xGa_{1-x})_yIn_{1-y}N, 0 \leq x \leq 1, 0 \leq y \leq 1)$ group semiconductor laser diode produced on a sapphire substrate.

FIG. 1 is a sectional view showing a semiconductor laser diode structure using a sapphire substrate.

In FIG. 1, a sapphire substrate 1 is shown wherein the substrate surface includes a {0001} oriented crystal growth surface washed with an organic solvent and then set in a crystal growth section of the crystal growth apparatus.

After the growth furnace is evacuated, hydrogen is supplied to it and heated to about 1,200° C. As a result, hydrocarbon group gases previously attached to the surface of sapphire substrate 1 are removed to a certain extent.

The temperature of sapphire substrate 1 is then reduced to about 600° C. Trimethylaluminum (TMA) and ammonia (NH$_3$) are then supplied forming AlN layer 2 having a thickness of about 50 nm on sapphire substrate 1. Subsequently, only the supply of TMA is stopped and the substrate temperature is increased to 1,040° C. TMA, trimethyl gallium (TMG) and silane (SiH$_4$) are then supplied to cause growth of Si-doped GaAlN layer 3, an n-type layer.

The wafer is then taken out from the growth furnace and masked at a portion of the surface of the GaAlN layer 3 with SiO$_2$ and returned to the furnace. The furnace being evacuated, hydrogen and NH$_3$ are supplied and the temperature is elevated to 1,040° C.

TMG is then supplied to cause growth of GaN layer 4 having a thickness of 0.5 microns on a wafer portion not masked by SiO$_2$.

Subsequently, TMA and biscyclopentadienyl magnesium (Cp$_2$Mg) are supplied to cause growth of doped GaAlN layer 5, a p-type layer, to a thickness of 0.5 microns. The SiO$_2$, used as a mask, is removed using a fluoric acid group etchant.

Subsequently, SiO$_2$ layer 7 is deposited on p-type doped GaAlN layer 5 and formed having a strip-like window 7A with dimensions of 1 mm by 5 microns. The wafer is then transferred to a vacuum chamber, and an electron beam irradiation treatment on p-type doped GaAlN layer 5 is carried out.

Typical conditions for the electron beam irradiation treatment are:

Electron beam acceleration voltage: 15 kV
Emission current: 120 microamperes or above
Electron spot diameter: 60 microns
Sample temperature: 297K Afterwards, metal electrodes 6A and 6B are formed on p-type doped GaAlN layer 5 over window 7A thereof and on n-type Si-doped GaAlN layer 3, respectively, thereby completing the crystal growth process.

EXAMPLE 2 using a Si substrate

Figure 2:
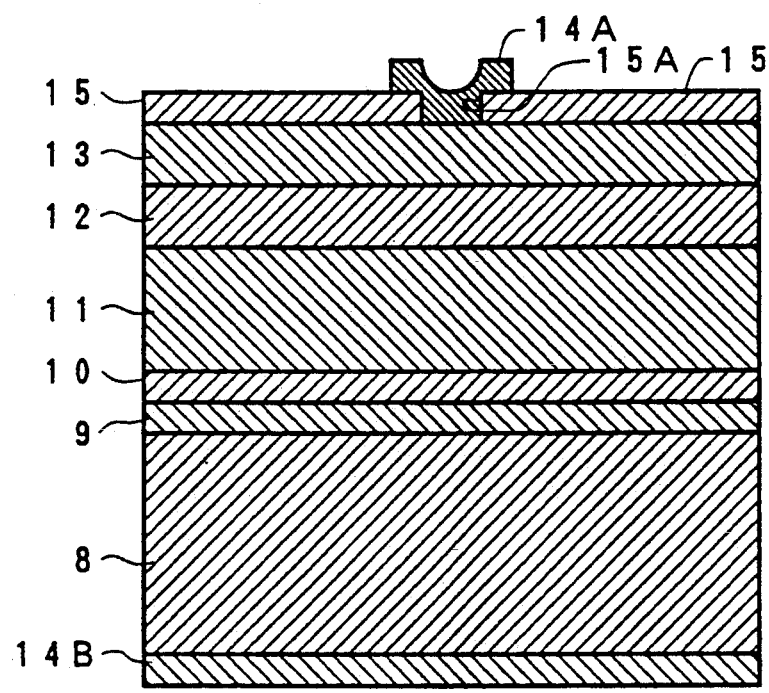
FIG. 2 is a sectional view showing another embodiment of the invention applied to a $(Al_xGa_{1-x})_yIn_{1-y}N, 0 \leq x \leq 1, 0 \leq y \leq 1)$ group semiconductor laser diode produced on a Si substrate.

FIG. 2 shows a laser diode structure produced on a Si substrate.

A low resistivity n-type Si {111} oriented surface substrate 8 is washed with an organic solvent and the oxide on its surface is then removed. The semiconductor is then placed in a crystal growth furnace. The furnace is evacuated and hydrogen is introduced. After the substrate is elevated in temperature to 1,000° C. to purify the surface of substrate 8, propane (C$_3$H$_8$) or acetylene (C$_2$H$_2$) is supplied. As a result, 3C-SiC thin film 9 is formed on the surface.

Subsequently, the growth furnace is evacuated once again to remove excess gas. Then, hydrogen is supplied to the growth furnace, the wafer temperature elevated to 600° C., and TMA and NH$_3$ are supplied, forming AlN thin film 10 on 3C-SiC film 9.

Subsequently, only the supply of TMA is stopped and the wafer temperature is elevated to 1,040° C. Afterwards, TMG, TMA and SiH$_4$ are supplied to cause growth of n-type GaAlN layer 11.

Subsequently, only the supply of TMA and SiH$_4$ is stopped to cause growth of GaN layer 12 to a thickness of 0.5 microns. Then, TMA and CP$_2$Mg are supplied to cause growth of Mg-doped GaAlN layer 13, a p- type layer, to a thickness of 0.5 microns.

Thereafter, SiO$_2$ layer 15 is deposited on Mg-doped GaAlN layer 13 and formed having strip-like window 15A with dimensions of 1 mm by 5 microns. Then, the wafer is transferred to a vacuum chamber, and p-type Mg-doped GaAlN layer 13 is irradiated with an electron beam. The conditions of the electron beam irradiation are the same as in the preceding embodiment. Afterward, electrode 14A associated with p-type Mg-doped GaAlN layer 13 is formed along window 15A while electrode 14B associated with n-type GaAlN layer 11 (i.e., low resistivity n-type Si substrate 8) is formed on the back surface of substrate 8.

EXAMPLE 3 using a 6H-SiC substrate

Figure 3:
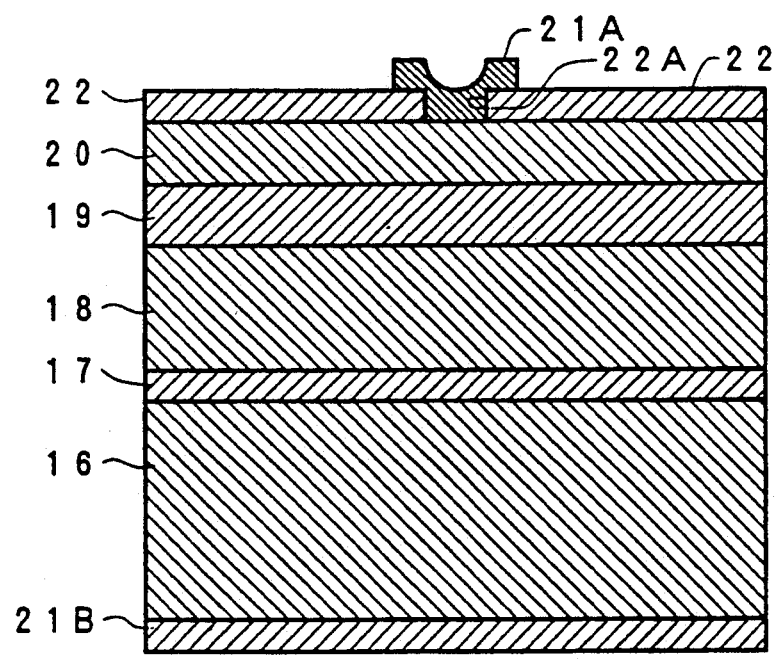
FIG. 3 is a sectional view showing a further embodiment of the invention applied to a $(Al_xGa_{1-x})_yIn_{1-y}N, 0 \leq x - 1, 0 \leq x \leq 1)$ group semiconductor laser diode produced on a 6H-SiC substrate.

FIG. 3 shows a laser diode produced on a 6H-SiC substrate.

A low resistivity n-type 6H-SiC {0001} oriented surface substrate 16 is washed with an organic solvent and then etched using a group etchant. Then, the substrate is set in a crystal growth section of a growth furnace and the growth furnace is evacuated. Hydrogen is supplied and the substrate temperature is elevated to 1,200° C.

Subsequently, as the substrate temperature is elevated to 1,040° C., hydrogen, TMG, SiH$_4$ and NH$_3$ are supplied to form n-type GaN buffer layer 17 to a thickness from 0.5 mm to 1 microns. Then, TMA is additionally supplied to cause growth of n-type GaAlN layer 18 on n-type GaN buffer layer 17.

Not unlike the previous laser diode having a Si substrate, GaN layer 19 having a thickness of 0.5 microns and p-type Mg-doped GaAlN layer 20 having a thickness of 0.5 microns are then formed on n-type GaAlN layer 18 under the same growth conditions.

A SiO$_3$ layer 22 is then deposited on Mg-doped GaAlN layer 20 and formed with a strip-like window 22A with dimensions of 1 mm by 5 microns. The wafer is then transferred to a vacuum chamber and p-type Mg-doped GaAlN layer 20 is irradiated with an electron beam. The electron beam irriation is carried out under identical conditions as in the previous embodiment.

Afterward, electrode 21A associated with p-type Mg-doped GaAlN 20 is formed along window 22A while an electrode 12B associated with n-type GaAlN layer 18 (i.e., low resistivity n-type 6H-SiC) is formed on the back surface of substrate 16.

EXAMPLE 4 using a GaN laser diode

Figure 4:
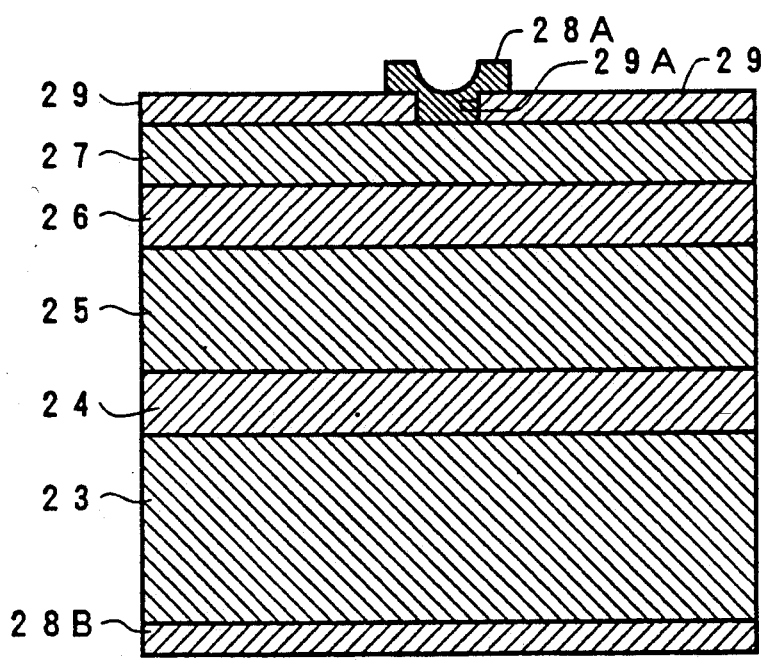
FIG. 4 is a sectional view showing a still further embodiment of the invention applied to a $(Al_xGa_{1-x})_yIn_{1-y}N, 0 \leq x \leq 1, 0 \leq y \leq 1)$ group semiconductor laser diode produced on a GaN substrate.

FIG. 4 shows a laser diode produced on a GaN substrate.

A low resistivity n-type GaN {0001} oriented surface substrate 23 is washed with an organic solvent and etched using an etchant in a group based on phosphoric acid and sulfuric acid. The substrate 23 is then set in a crystal growth furnace.

When the growth furnace is evacuated, hydrogen and NH$_3$ are supplied, and the substrate temperature is elevated to 1,040° C. The system is left in this state for 5 minutes.

TMG and SiH$_4$ are then supplied to form n-type GaN buffer layer 24 to a thickness of 0.5 to 1 micron. TMA is supplied afterward to cause growth of n-type GaAlN layer 25.

Not unlike the laser diode of the previous embodiment having an Si substrate, GaN layer 26 with a thickness of 0.5 microns and p-type Mg-doped GaAlN layer 27 with a thickness of 0.5 microns are formed on n-type GaAl layer 25 under the same conditions.

A SiO$_2$ is then deposited on Mg-doped GaAlN layer 27 and formed having a strip-like window 29A with dimensions of 1 mm by 5 microns. The wafer is transferred to a vacuum chamber and p-type Mg-doped GaAlN layer 27 is irradiated with an electron beam. The electron beam irradiation is carried out under the same conditions as in the previous embodiment.

Finally, electrode 28A associated with p-type Mg-doped GaAlN layer 27 is formed along window 29A, while electrode 28B associated with n-type GaAlN layer 25 is formed on the back surface of substrate 23.

With any of the above laser diodes, laser emission can be obtained at room temperature.

EXAMPLE 5 defining an active layer having a multiple-layer structure

Figure 5:
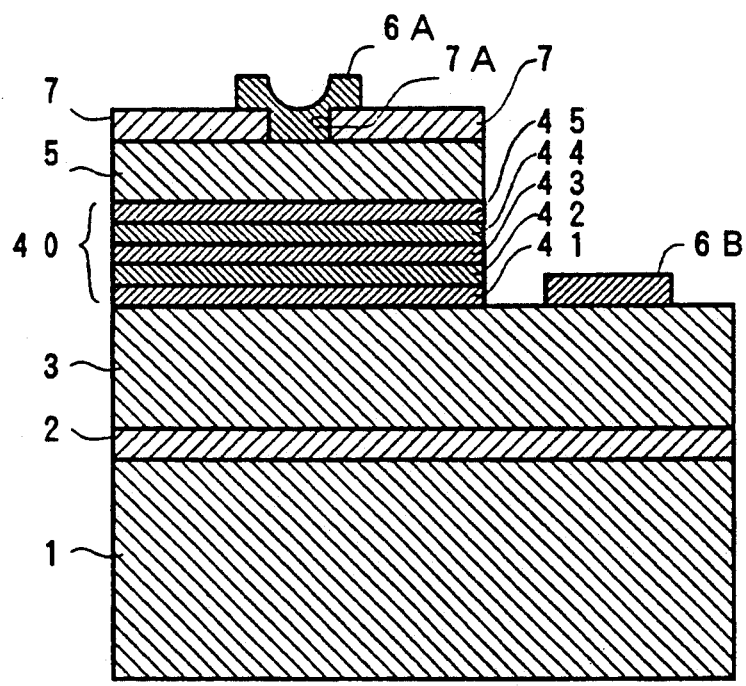
FIG. 5 is a sectional view showing a yet further embodiment of the invention applied to a $(Al_xGa_{1-x})_yIn_{1-y}N, 0 \leq x \leq 1, 0 \leq y \leq 1)$ group semiconductor laser diode having multiple heterojunctions.

FIG. 5 refers to Example 5, which illustrates a laser diode having a similar structure as that of Example 1. In this embodiment, active layer 40, having multiple heterojunctions, is sandwiched between n-type GaAlN layer 3 and p-type GaAlN layer 5 and subjected to an electron beam irradiation treatment. The active layer 40 has a five-layer structure, each layer having a same thickness of 0.1 microns, including non-doped n-type GaN layer 41, n-type GaAlN layer 42, non-doped n-type GaN layer 43, n-type GaAlN layer 44 and non-doped n-type GaN layer 45. N-type GaAlN layers 42 and 44 are characterized as having broader band gaps than those of GaN layers 41, 43 and 45. The device of Example 5 constitutes a five-layer heterojunction laser diode structure.

EXAMPLE 6 defining a single hetero-junction

Figure 6:
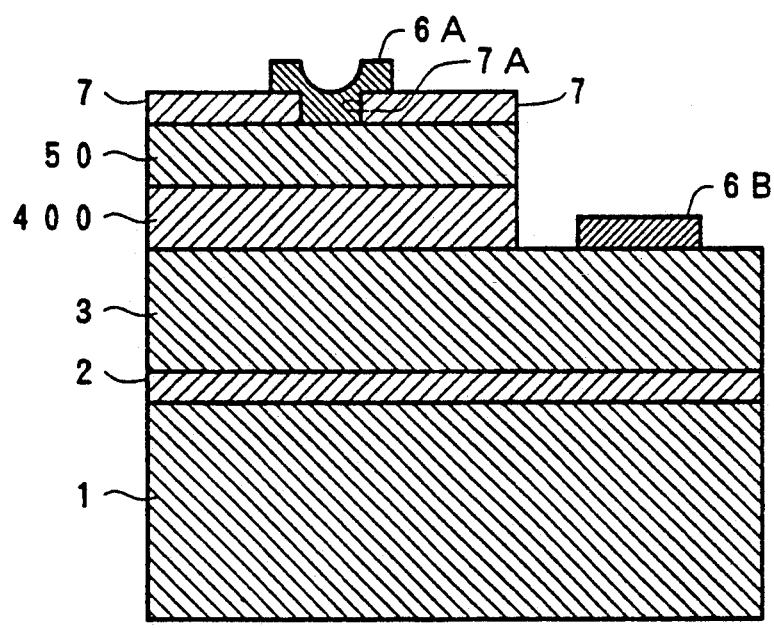
FIG. 6 is a sectional view showing a $(Al_xGa_{1-x})_yIn_{1-y}N, 0 \leq x \leq 1, 0 \leq y \leq 1)$ group semiconductor laser diode having a single heterojunction.

FIG. 6 refers to Example 6 which illustrates a laser diode having a similar structure as that of Example 1. On n-type GaAlN layer 3 is formed non-doped n-type GaN layer 400 having a narrower band gap than that of GaAlN, at a thickness of 0.5 microns, and on n-type GaN layer 400 is formed GaN layer 50 doped with magnesium (Mg). The GaN layer 50 is partly made to have p-type conductivity through electron beam irradiating window portion 7A, not masked by SiO$_2$ layer 7, under conditions similarly set forth in the growth process of Example 1, and resulting in the formation of p-type GaN layer 50. The device of Example 6 constitutes a single heterojunction laser diode structure.

EXAMPLE 7 defining a monojunction

Figure 7:
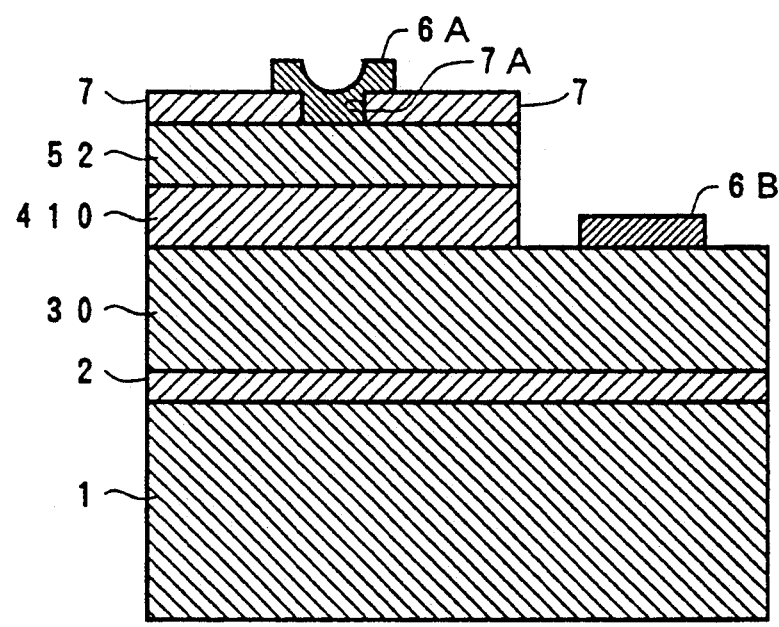
FIG. 7 is a sectional view showing a $(Al_xGa_{1-x})_yIn_{1-y}N, 0 \leq x \leq 1, 0 \leq y \leq 1)$ group semiconductor laser diode having a monojunction.

FIG. 7 refers to Example 7 which illustrates a laser diode having a similar structure as that of Example 1. On a high conductivity n+-type GaAlN layer 30 doped with silicon (Si) is formed a 0.5 micron non-doped n-type GaN layer 410, on which is formed a GaN layer 52 doped with magnesium (Mg) at a thickness of 0.5 microns. GaN layer 52 is partly made to have p-type conductivity through electron beam irradiating through window portion 7A, not masked by a SiO$_2$ layer 7, under conditions similarly set forth in the growth process of Example 1, and resulting in p-type GaN layer 52. The resultant device of Example 7 constitutes a monojunction laser diode structure.

In accordance with the present invention, by taking advantage of the p-type properties inherent in a (Al$_x$Ga$_{1-x}$)$_y$In$_{1-y}$N semiconductor material which has undergone e beam irradiation treatment, a semiconductor laser diode is provided having an emission wavelength region extending into the blue to violet and also ultraviolet spectra of light characterized by very short wavelengths.

Furthermore, as the substrate for use in the manufacture of aluminum gallium indium nitride (Al$_x$Ga$_{1-x}$)$_y$In$_{1-y}$N single crystals, it has been shown by Example above that any one of sapphire, silicon (Si), 6H silicon carbide (6H-SiC) and gallium nitride (GaN) may be used.

When sapphire is used for the substrate, a layer including an AlN thin layer, deposited at a low temperature, i.e., about 600° C., is desirable as a buffer layer.

Where Si is used for the substrate, a layer including a single thin layer of 3C-SiC or two thin layers, one being of 3C-SiC and the other being of AlN, is desirable as a buffer layer.

Where 6H-SiC is used for the substrate, the single crystal is desirably produced either directly or using GaN as a buffer layer.

Where GaN is used for the substrate, the single crystal is produced directly.

Where Si, 6H-SiC and GaN are used for the substrate, an n-type single crystal is used.

Where sapphire is used for the substrate, just before causing the growth of (Al$_x$Ga$_{1-x}$)$_y$In$_{1-y}$N, the substrate temperature is set to temperature (for instance 600° C.), and at least a compound aluminum (Al) and nitrogen hydride are introduced into the growth furnace to form a thin buffer layer of AlN on the sapphire substrate surface.

The introduction of the Al-containing compound is then stopped, and the substrate temperature is reset. Then, a compound containing Al, a compound containing gallium (Ga) and a compound containing indium (In) are introduced for growing an n-type (Al$_x$Ga$_{1-x}$)$_y$In$_{1-y}$N single crystal to obtain a desired blend crystal composition.

In the above embodiment, compounds containing donor impurity elements, e.g., Si, oxygen (0), sulfur (S), selenium (Se), tellurium (te), etc., may be introduced simultaneously for reducing the resistivity of the n-type single crystal.

When doping with a donor impurity, the concentration of the n-type layer may be made uniform. To facilitate the formation of an n-type ohmic contact electrode, the impurity concentration may be set to be high in an initial stage of the n-layer growth and be zero or low in the neighborhood of the pn junction.

When the wafer is taken out of the furnace, the sample surface is covered with a material serving as a mask for selective growth, e.g., silicon oxide (SiO$_2$), and then the wafer is returned to the furnace. Alternatively, the growth is continued without taking out the wafer.

A compound containing Al, a compound containing Ga, a compound containing In, nitrogen hydride, and a compound containing an acceptor impurity element, e.g., beryllium (Be), magnesium (Mg), zinc (Zn), cadmium (Cd), carbon (C), etc., are introduced into the growth furnace for growing a p-type layer $(Al_xGa_{1-x})_yIn_{1-y}N$ single crystal doped with an acceptor impurity such that a desired blend crystal composition can be obtained.

The thickness of the grown acceptor-doped layer is determined by taking the electron beam invasion length into consideration since the layer will undergo electron beam irradiation treatment. Subsequently, the wafer is taken out from the growth furnace, and the electron beam irradiation treatment of the acceptor-doped $(Al_xGa_{1-x})_yIn_{1-y}N$ layer is carried out.

The region subjected to the electron beam irradiation treatment is the entire sample surface or a part thereof, as would be the case, in a strip-like shape surface. In case where the entire sample surface is irradiated with an electron beam, an insulating layer is deposited on the acceptor-doped layer (i.e., p-type layer) and formed with a strip-like window, and a metal is deposited over the window to form an ohmic contact electrode for the p-type layer. Where the electron beam irradiation treatment is carried out to provide a strip-like shape, the ohmic contact electrode for the p-type layer is formed by depositing a metal such as to cover the region irradiated with the electron beam either partly or entirely. The final shape of the portion where the p-type layer and the metal are contiguous, has a strip-like shape.

An electrode for the n-type layer may be formed after removing the selective growth mask. Alternatively, the inner n-type layer may be formed with a window by etching a portion of the acceptor-doped layer (i.e., p-type layer) from the surface side, and then forming an ohmic contact electrode by depositing a metal.

Alteratively, where an n-type Si, 6H-SiC or GaN is used as the substrate, substantially the same techniques are undergone for the manufacture of a laser diode semiconductor. As an exception, the selective growth technique is not used, instead the electrodes for the p- and n-layers are formed on opposite sides of the laser diode structure. Hence, for the electrode associated with the n-type layer, an ohmic contact electrode is formed by depositing a metal on the entire back surface of the substrate.

Described so far is the basic method of manufacturing a semiconductor laser diode having a pn junction structure with crystals having the same composition.

When producing a semiconductor device utilizing junctions formed by crystals having different blend crystal compositions, or as commonly termed, heterojunctions, the process of manufacture is not unlike that of devices formed having the same blend crystal composition insofar as a pn junction is formed.

Where a single heterojunction is formed, in addition to the pn junction formed by crystals having the same blend crystal composition, an n-type crystal having a greater band gap energy is joint to the n-type layer side. These joint layers prevent the diffusion of holes as minority carriers.

The intensity of light from a $(Al_xGa_{1-x})_yIn_{1-y}N$ group single crystal in the neighborhood of the gap energy is particularly high in the n-type layer, and therefore it is necessary to use an n-type crystal for the active layer.

The $(Al_xGa_{1-x})_yIn_{1-y}N$ group single crystals have s structures to those of the $(Al_xGa_{1-x})_yIn_{1-y}As$ and $(Al_xGa_{1-x})_yIn_{1-y}P$ group single crystals, and the band discontinuity ratio is thought to be higher with the conduction band than with the valance band. With the $(Al_xGa_{1-x})_yIn_{1-y}N$ group single crystals, however, the effective mass of holes is comparatively high, and therefore a heterojunction formed by n-type crystals is effective for preventing the hole diffusion.

Where two heterojunctions are formed, n-and p-type crystals having large band gap energies are joined to opposite sides of an n-type crystal having a comparatively small gap energy to sandwich the n-type crystal with the small band gap energy.

Where multiple heterojunctions are formed, pluralities of n-type thin film crystals having comparatively large and small band gaps are joined together to form a laminate structure, and an n- and a p-type crystal having large band gaps are joined to opposite sides of the lamination to sandwich the plurality of heterojunctions. The smaller the band gap energy the higher the refractive index of an $(Al_xGa_{1-x})_yIn_{1-y}N$ group single crystal. Thus, the heterojunction structure sandwiched between large band gap crystals is effective for the concealing of light much like semiconductor diodes based on other $(Al_xGa_{1-y}As$ and $(Al_xGa_{1-x})_yIn_{1-y}P$ group single crystals.

In the case of utilizing a heterojunction, much like the case of a pn junction between crystals having the same composition, the carrier concentration in the neighborhood of the portion in contact with an electrode may be made high for readily providing the ohmic contact electrode composition.

The carrier concentration in an n-type crystal is controlled according to the doped donor impurity concentration, while the carrier concentration of a p-type crystal is controlled according to the doped acceptor impurity concentration and also to the conditions of the electron beam irradiation treatment. More specifically, for ready formation of the ohmic contact electrode, it is possible to join a crystal, which permits ready realization of a high carrier concentration, for contact with the metal.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A gallium nitride group compound semiconductor laser diode comprising at least one pn junction layer constituting an active layer disposed between an n-type layer formed from a gallium nitride group compound semiconductor material defined by the composition equation $(Al_xGa_{1-x})_yIn_{1-y}N$ (where $0 \leq x \leq 1$ and $0 \leq y \leq 1$) and a p-type layer, doped with an acceptor impurity, which is obtained by electron beam irradiating a gallium nitride group compound semiconductor material defined by the composition equation $(Al_{x'}Ga_{1-x'})_yIn_{1-y'}N$ (where $0 \leq x' \leq 1$, $0 \leq y' \leq 1$, $x=x'$ or $x \neq x'$, and, $y=y'$ or $y \neq y'$), contact portions of said p-type layer constituting electrode contacts.

2. The gallium nitride group compound semiconductor laser diode of claim 1, wherein said n- and p-type lasers are defined as having band gap energies of equal value.

3. The gallium nitride group compound semiconductor laser diode of claim 1, wherein at least one layer of said n- type layer and said p-type layer has a junction formed with two layers of a comparatively large band gap energy and a comparatively small band gap energy.

4. The gallium nitride group compound semiconductor laser diode of claim 1, wherein said pn junction has a comparatively small band energy gap formed from a gallium nitride group compound semiconductor material which is defined by the composition equation $(Al_{x'}Ga_{1-x'})_{y'}In_{1-y'}N$ (where $0 \leq x' \leq 1$, $0 \leq y' \leq 1$, and excluding $x'=y'=1$), said n-type and p-type layers having comparatively large band gaps of equal or different value.

5. The gallium nitride group compound semiconductor laser diode of claim 4, wherein said active layer comprises two or more laminated layers and includes a first layer formed from a gallium nitride group compound semiconductor material defined by the composition equation $(Al_xGa_{1-x})_yIn_{1-y}N$ (where $0 \leq x \leq 1$, $0 \leq y \leq 1$) and a second layer formed from a gallium nitride group compound semiconductor material which is defined by the composition equation $(Al_{x'}Ga_{1-x'})_{y'}In_{1-y'}N$ (where $0 \leq x' \leq 1$, $0 \leq y' \leq 1$, $x=x'$ $x \neq x'$ or and $y=y'$ or $y \neq y'$), said first and second layers having different band gap energies.

6. The gallium nitride group compound semiconductor laser diode of claim 1, wherein said contact portions of said p-type layer form a strip-like shape.

7. The gallium nitride group compound semiconductor laser diode of claim 1, further comprising a substrate made from any one of a group of sapphire, Si, 6H-SiC and GaN.

* * * * *